US010396181B2

(12) United States Patent
Bergendahl et al.

(10) Patent No.: US 10,396,181 B2
(45) Date of Patent: *Aug. 27, 2019

(54) FORMING STACKED NANOWIRE SEMICONDUCTOR DEVICE

(71) Applicant: International Business Machines Corporation, Armonk, NY (US)

(72) Inventors: Marc A. Bergendahl, Troy, NY (US); Kangguo Cheng, Schenectady, NY (US); Fee Li Lie, Albany, NY (US); Eric R. Miller, Schenectady, NY (US); Jeffrey C. Shearer, Albany, NY (US); John R. Sporre, Albany, NY (US); Sean Teehan, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/047,042

(22) Filed: Jul. 27, 2018

(65) Prior Publication Data

US 2018/0337261 A1 Nov. 22, 2018

Related U.S. Application Data

(63) Continuation of application No. 15/008,615, filed on Jan. 28, 2016, now Pat. No. 10,074,730.

(51) Int. Cl.
*H01L 29/06* (2006.01)
*H01L 29/66* (2006.01)
(Continued)

(52) U.S. Cl.
CPC .. *H01L 29/66742* (2013.01); *H01L 21/02532* (2013.01); *H01L 21/02603* (2013.01); *H01L 21/3065* (2013.01); *H01L 21/30604* (2013.01); *H01L 29/0673* (2013.01); *H01L 29/0676* (2013.01); *H01L 29/16* (2013.01); *H01L 29/401* (2013.01); *H01L 29/42392* (2013.01); *H01L 29/6656* (2013.01); *H01L 29/66439* (2013.01); *H01L 29/66545* (2013.01);
(Continued)

(58) Field of Classification Search
CPC ......... H01L 21/02603; H01L 21/30604; H01L 21/02532; H01L 29/6656; H01L 29/0676; H01L 29/785; H01L 29/66795; H01L 29/16; H01L 29/7858
See application file for complete search history.

(56) References Cited

U.S. PATENT DOCUMENTS

| 2017/0221708 A1 | 8/2017 | Bergendahl et al. |
| 2017/0222024 A1 | 8/2017 | Bergendahl et al. |
| 2018/0053837 A1 | 2/2018 | Bi et al. |

OTHER PUBLICATIONS

Bi et al., "Formation of Inner Spacer on Nanosheet MOSFET," U.S. Appl. No. 15/915,238, filed Apr. 23, 2018.
(Continued)

*Primary Examiner* — Didarul A Mazumder
*Assistant Examiner* — Wasiul Haider
(74) *Attorney, Agent, or Firm* — Cantor Colburn LLP; Vazken Alexanian

(57) ABSTRACT

A semiconductor device comprises a nanowire arranged over a substrate, a gate stack arranged around the nanowire, a spacer arranged along a sidewall of the gate stack, a cavity defined by a distal end of the nanowire and the spacer, and a source/drain region partially disposed in the cavity and in contact with the distal end of the nanowire.

20 Claims, 13 Drawing Sheets

(51) Int. Cl.
*H01L 29/423* (2006.01)
*H01L 29/786* (2006.01)
*H01L 21/3065* (2006.01)
*H01L 21/02* (2006.01)
*H01L 21/306* (2006.01)
*H01L 29/16* (2006.01)
*H01L 29/78* (2006.01)
*H01L 29/40* (2006.01)
*H01L 29/775* (2006.01)

(52) U.S. Cl.
CPC ...... *H01L 29/66795* (2013.01); *H01L 29/775* (2013.01); *H01L 29/785* (2013.01); *H01L 29/78618* (2013.01); *H01L 29/78651* (2013.01); *H01L 29/78696* (2013.01); *H01L 2029/7858* (2013.01)

(56) References Cited

OTHER PUBLICATIONS

IBM "List of IBM Patents or Patent Applications Treated as Related; (Appendix P)", Filed Jul. 27, 2018, 2018, 2 pages.

FORMING STACKED NANOWIRE SEMICONDUCTOR DEVICE

DOMESTIC PRIORITY

This application is a continuation of U.S. patent application Ser. No. 15/008,615, filed Jan. 28, 2016, the content of which is incorporated by reference herein in its entirety.

BACKGROUND

The present invention generally relates to complimentary metal-oxide semiconductors (CMOS) and metal-oxide-semiconductor field-effect transistors (MOSFET), and more specifically, to nanowire technology.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Since the fin provides a three dimensional surface for the channel region, a larger channel length may be achieved in a given region of the substrate as opposed to a planar FET device.

As CMOS scales to smaller dimensions, nanowire devices provide advantages. A nanowire is often suspended above the substrate by source/drain regions or the gate stack. Since the nanowire is suspended, the channel region of a nanowire device has four surfaces, or 360 degrees of exposed area. The gate stack may be formed around the channel region of the nanowire to form a gate-all-around-device. The nanowire may provide even more surface area and greater channel length than a FinFET device or planar FET device in a given region of a substrate. Nanowire FETs may be formed from stacked nanowires provide even greater efficiency. Stacked nanowires provide, for example, increased drive current within a given layout area.

Gate spacers form an insulating film along gate sidewalls. Gate spacers may also initially be formed along sacrificial gate sidewalls in replacement gate technology. The gate spacers are used to define source/drain regions in active areas of a semiconductor substrate located adjacent to the gate.

Device scaling drives the semiconductor industry, which reduces costs, decreases power consumption, and provides faster devices with increased functions per unit area. Improvements in optical lithography have played a major role in device scaling. However, optical lithography has limitations for minimum dimensions, which are determined by the wavelength of the irradiation.

SUMMARY

According to an embodiment of the present invention, a method for forming a nanowire semiconductor device comprises forming a nanowire stack comprises a first nanowire and a second nanowire arranged on the first nanowire, forming a sacrificial gate over the nanowire stack, forming a sacrificial spacer adjacent to the sacrificial gate, removing an exposed portion of the first nanowire to form a first cavity partially defined by the sacrificial spacer, the first nanowire, and the second nanowire, removing the sacrificial spacer, depositing a layer of spacer material adjacent to the sacrificial gate and in the first cavity, removing a portion of the layer of spacer material to form a spacer adjacent to the sacrificial gate and the first nanowire, removing exposed portions of the second nanowire, removing a portion of the second nanowire to form a second cavity, the second cavity partially defined by the spacer and the second nanowire, and epitaxially growing a source/drain region in the second cavity from exposed portions of the second nanowire.

According to another embodiment of the present invention, a method for forming a nanowire semiconductor device comprises forming a semiconductor stack on a substrate, the semiconductor stack comprises a first semiconductor layer and a second semiconductor layer, removing portions of the semiconductor stack to form a nanowire stack, the nanowire stack comprises a first nanowire and a second nanowire, forming a sacrificial gate over the nanowire stack, depositing a first layer of spacer material along sidewalls of the sacrificial gate, removing portions of the spacer material to form a sacrificial spacer long sidewalls of the sacrificial gate, removing an exposed portion of the first nanowire to form a first cavity partially defined by the sacrificial spacer, the first nanowire, and the second nanowire, removing the sacrificial spacer, depositing a second layer of spacer material adjacent to the sacrificial gate and in the first cavity, removing a portion of the second layer of spacer material to form a spacer adjacent to the sacrificial gate and the first nanowire, removing exposed portions of the second nanowire, removing a portion of the second nanowire to form a second cavity, the second cavity partially defined by the spacer and the second nanowire, and epitaxially growing a source/drain region in the second cavity from exposed portions of the second nanowire.

According to yet another embodiment of the present invention, a semiconductor device comprises a nanowire arranged over a substrate, a gate stack arranged around the nanowire, a spacer arranged along a sidewall of the gate stack, a cavity defined by a distal end of the nanowire and the spacer, and a source/drain region partially disposed in the cavity and in contact with the distal end of the nanowire.

DETAILED DESCRIPTION

Stacked nanowire devices may be formed by, for example, forming alternating layers of semiconductor materials on a substrate. For example, alternating layers of silicon germanium and silicon may be formed on a substrate and patterned into a stack of nanowires using, for example, lithographic patterning and etching process such as, for example, reactive ion etching (RIE) or another suitable etching process. During the fabrication process, the nanowires in the stack of nanowires may be isolated by, for example, performing a selective anisotropic etching process that undercuts the selected nanowires to expose the selected nanowires. For example, a nanowire stack having alternating layers of silicon germanium and silicon may be etched to selectively remove the silicon germanium nanowires such that suspended silicon nanowires remain having a channel region that is exposed 360 degrees such that subsequently a gate stack may be formed that surrounds the channel region of the silicon nanowires in a gate-all-around arrangement.

As semiconductor technology continues to be reduced in scale, the pitch of the contacts between devices becomes smaller. The spacers arranged along sidewalls of the gate stacks between the gate stacks and the contacts are thus, closer together. The reduced contact pitch and the distance between adjacent spacers may result poorly formed spacer that do not fully surround the semiconductor nanowires during fabrication of the nanowire FET devices.

Figure 1:
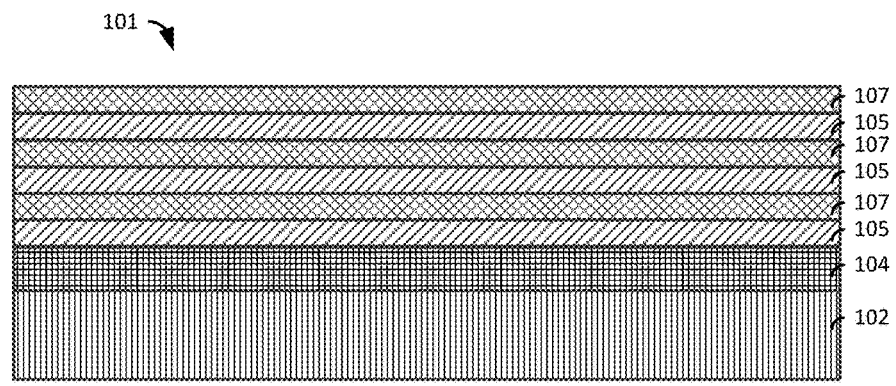
FIG. 1 illustrates a side view of a semiconductor-on-insulator (SOI) substrate and alternating layers of semiconductor materials arranged on the SOI substrate.

FIG. 1 illustrates a side view of a semiconductor-on-insulator (SOI) substrate and alternating layers of semiconductor materials arranged on the SOI substrate. The SOI substrate includes a semiconductor layer 102, an insulator layer 104 arranged on the semiconductor layer 102, a stack of nanowire material layers 101 (described below) is arranged on the insulator layer 104. The SOI substrate can be formed by any suitable technique such as, for example wafer bonding, Smartcut™, SIMOX (Separation by IMplanted Oxygen).

The semiconductor layer 102 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

The insulator layer 104 may include, for example, a buried oxide (BOX) material or other suitable insulator materials. Examples of suitable insulator materials include, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The thickness of insulator layer 104 generally varies and is not intended to be limited. In one aspect, the thickness of the insulator layer 104 is in a range from about 10 nm to about 1000 nm. The insulator layer 104 can be formed by any suitable process such as thermal oxidation, thermal nitridation, chemical vapor deposition (CVD).

A stack of nanowire material layers 101 is arranged on the insulator layer 104. The nanowire material layers in the illustrated embodiment include a first nanowire material layer 105 and a second nanowire material layer 107 arranged on the first nanowire material layer 105. The stack of nanowire material layers 101 may include any number of alternating nanowire material layers 105 and 107. In the illustrated embodiment, the first nanowire material layer 105 includes a silicon germanium material and the second nanowire material layer 107 includes a silicon material. In alternate exemplary embodiments, the first nanowire material layer 105 may be a silicon material while, the second nanowire material layer may be silicon germanium. The stack of nanowire material layers 101 may be formed by any suitable process. The germanium concentration (atomic concentration) in the SiGe layer ranges from about 15% to 99% and more preferably from about 25% to 60%. The Si/SiGe stack can be formed by epitaxially growth by using the SOI layer (the bottom layer of 105) as the seed layer. The epitaxial growth can be done by any suitable techniques such as ultrahigh vacuum chemical vapor deposition (UHVCVD) rapid thermal chemical vapor deposition (RTCVD), Metalorganic Chemical Vapor Deposition (MOCVD), low-pressure chemical vapor deposition (LP-CVD), limited reaction processing CVD (LRPCVD), molecular beam epitaxy (MBE). Each layer is stacked nanowire has a non-limiting thickness ranging from about 3-20 nm, more preferably about 5-10 nm.

Figure 2:
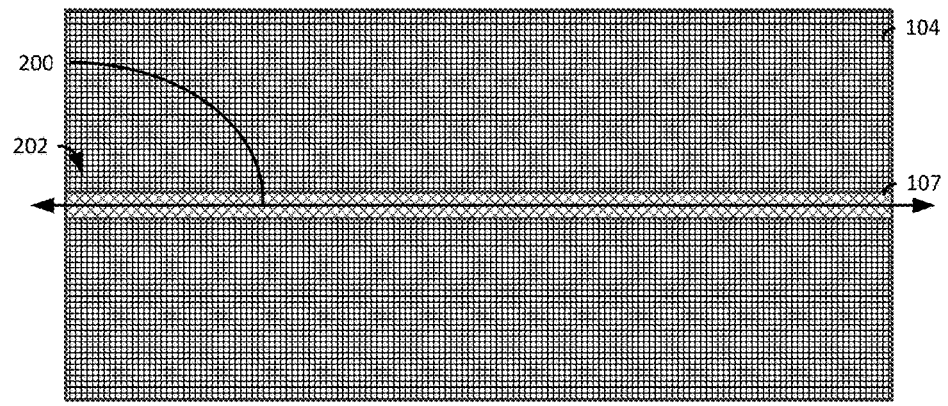
FIG. 2 illustrates a top view a stack of nanowires that has been formed on the insulator layer.

FIG. 2 illustrates a top view a stack of nanowires 202 that has been formed on the insulator layer 104. The stack of nanowires 202 may be formed by any suitable lithographic patterning and etching process such as, for example, a reactive ion etching (RIE) process that removes exposed portions of the stack of nanowire material layers 101 and exposes portions of the insulator layer 104 to form first semiconductor material nanowires (first nanowires) 106 and second semiconductor material nanowires (second nanowires) 108. The stack of nanowires 202 are arranged substantially coplanar in a first plane indicated by the line 200. Alternatively, a sidewall image transfer process can be used to pattern the stacked nanowires.

Figure 3:
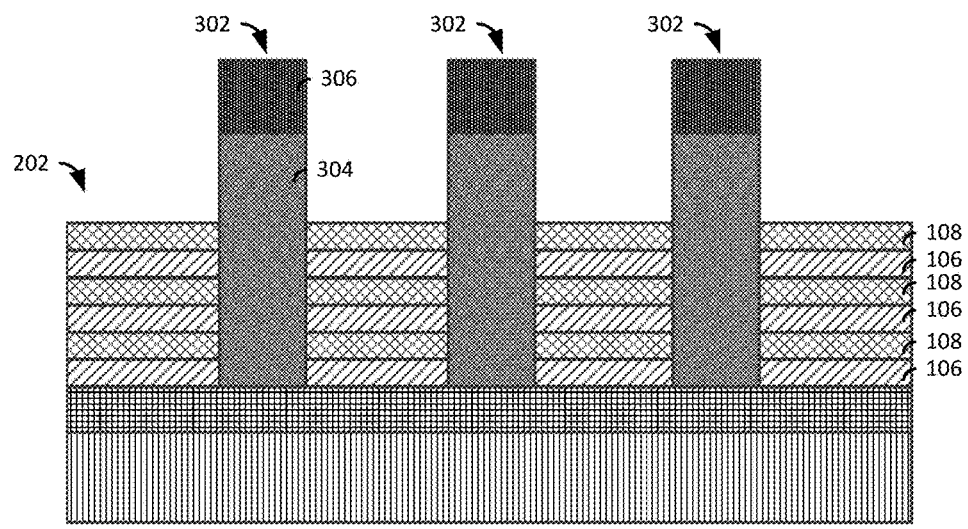
FIG. 3 illustrates a front view of the resultant structure following the formation of sacrificial (dummy) gates over portions of the stack of nanowires.

FIG. 3 illustrates a front view of the resultant structure following the formation of sacrificial (dummy) gates 302 over portions of the stack of nanowires 202. The sacrificial gates 302 in the exemplary embodiment are formed by depositing a layer of sacrificial gate material such as, for example, amorphous silicon (aSi), or polycrystalline silicon (polysilicon) material or another suitable sacrificial gate material. The sacrificial gate 302 may further comprises a sacrificial gate dielectric material such as silicon oxide between the nanowires and aSi or polysilicon material.

The layer sacrificial gate material (not shown) may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 306. Hardmask layer may be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching is performed to remove exposed portions of the hardmask layer and the layer of sacrificial gate material form the sacrificial gates 302 and the gate caps 306.

Figure 4:
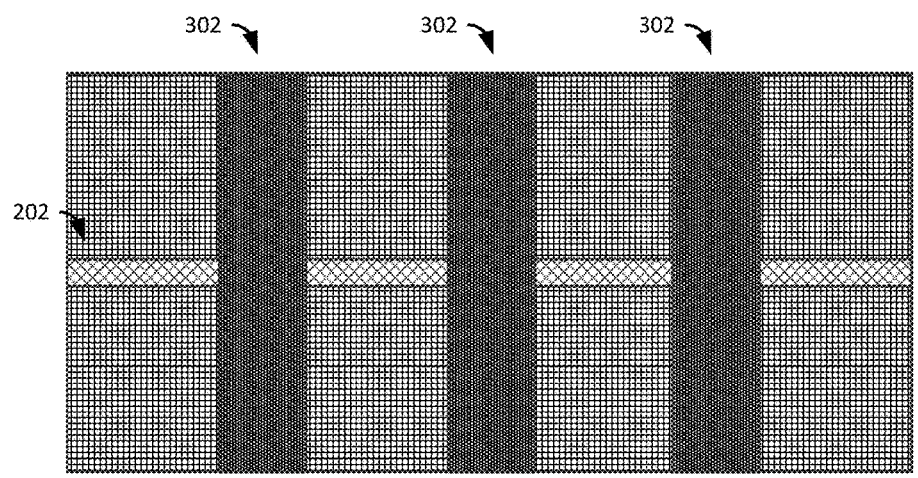
FIG. 4 illustrates a top view of the stack of nanowires and the sacrificial gates.

FIG. 4 illustrates a top view of the stack of nanowires 202 and the sacrificial gates 302.

Figure 5:
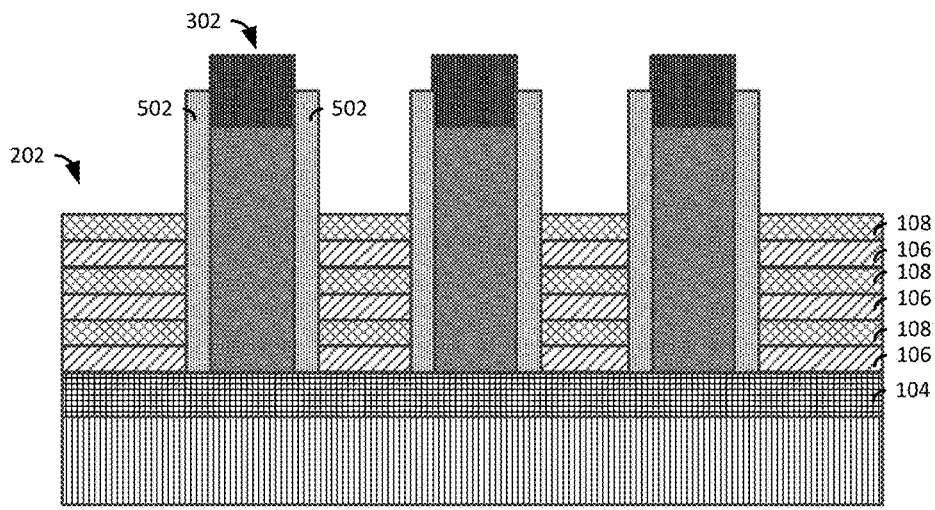
FIG. 5 illustrates a front view after sacrificial spacers have been formed adjacent to the sacrificial gate stacks.

FIG. 5 illustrates a front view after sacrificial spacers 502 have been formed adjacent to the sacrificial gate stacks 302. The sacrificial spacers 502 in the illustrated embodiment are formed by depositing a layer of spacer material (not shown) over the exposed portions of the insulator layer 104, the stack of nanowires 202, and the sacrificial gates 302. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a deposition process, for example, chemical vapor deposition (CVD) or physical vapor deposition (PVD). The layer of spacer material is formed with a thickness of about 3-15 nm. Following the deposition of the layer of spacer material, a suitable anisotropic etching process such as, for example, a reactive ion etching process is performed to remove portions of the layer of spacer material and form the sacrificial spacers 502.

Figure 6:
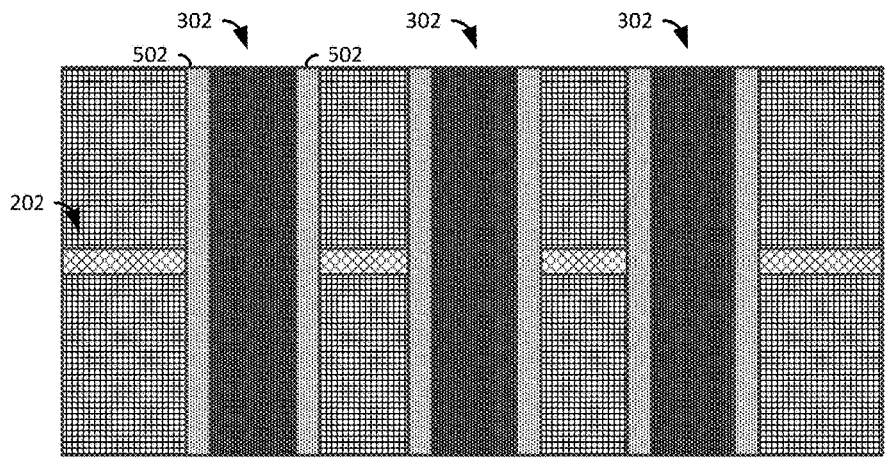
FIG. 6 illustrates a top view following the formation of the sacrificial spacers.

FIG. 6 illustrates a top view following the formation of the sacrificial spacers 502.

Figure 7:
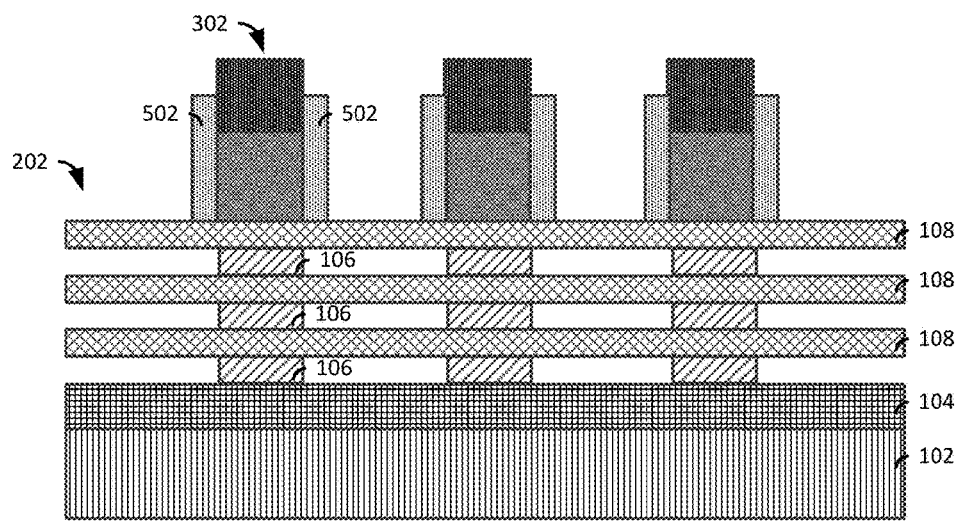
FIG. 7 illustrates a cut-away view along the line A-A (of FIG. 8) following the performance of a selective isotropic etching process that is selective to the first nanowire (of FIG. 5).

FIG. 7 illustrates a cut-away view along the line A-A (of FIG. 8) following the performance of a selective isotropic etching process that is selective to the first nanowire 106 (of FIG. 5). The etching process removes exposed portions of the second nanowire 108. The removal of the exposed portions of the second nanowire 108 exposes the tops, sides, and bottoms of the nanowires 106. The isotropic etching process is timed to remove portions of the first nanowire 106 under the sacrificial spacers 502. In an embodiment, the first nanowire 106 is silicon and the second nanowire 108 is SiGe. SiGe can be etched selective to Si, for example, by an aqueous etchant containing hydroperoxide ($H_2O_2$) and ammonia ($NH_4OH$).

Figure 8:
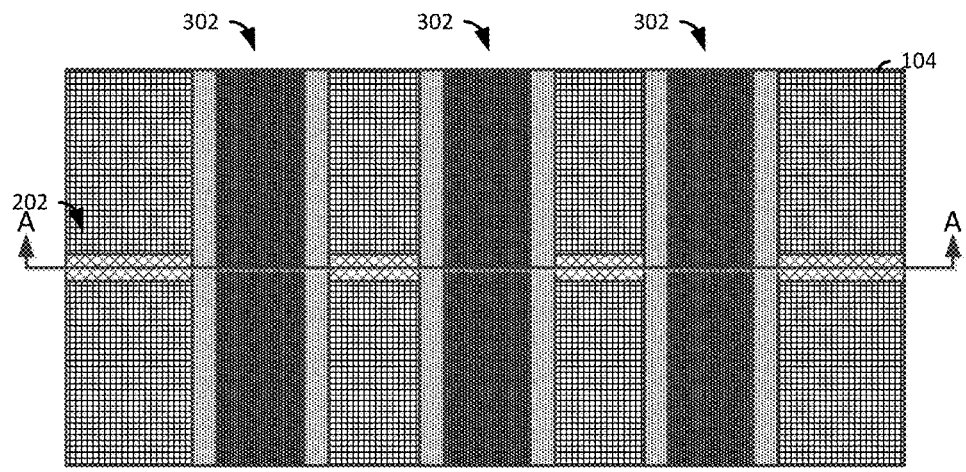
FIG. 8 illustrates a top view of the resultant structure following the removal of portions of the first nanowire material layer.

FIG. 8 illustrates a top view of the resultant structure following the removal of portions of the first nanowire material layer 106.

Figure 9:
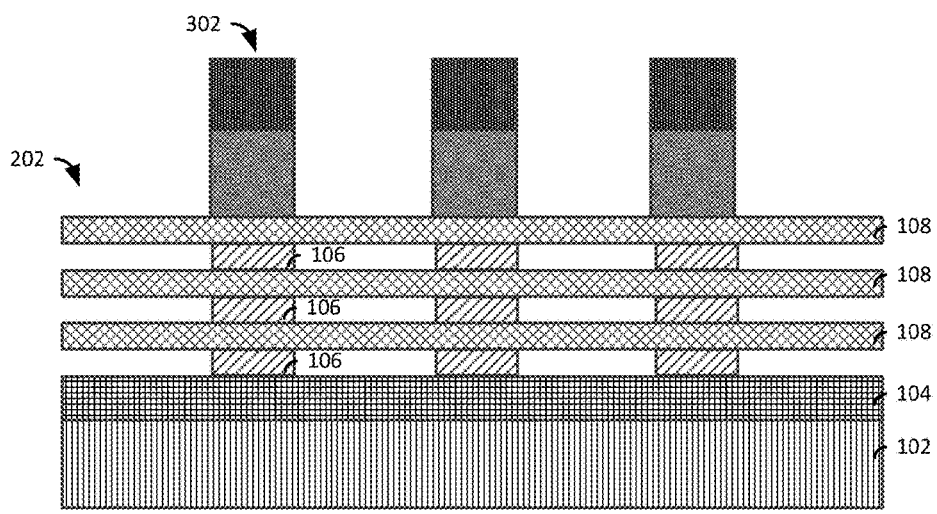
FIG. 9 illustrates a cut-away view along the line A-A (of FIG. 10) following the removal of the sacrificial spacers (of FIG. 7) following a selective isotropic etching process.

FIG. 9 illustrates a cut-away view along the line A-A (of FIG. 10) following the removal of the sacrificial spacers 502 (of FIG. 7) following a selective isotropic etching process. That exposes the sidewalls of the sacrificial gate 302 and portions of the nanowires 108.

Figure 10:
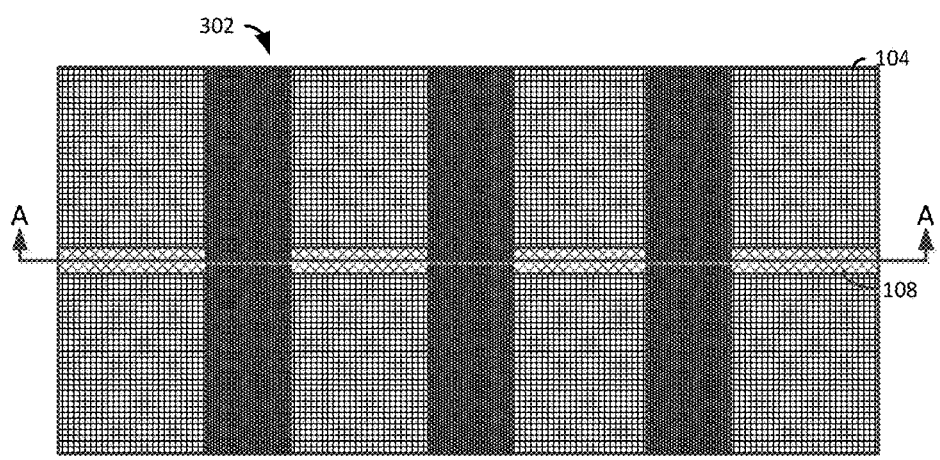
FIG. 10 illustrates a top view of the resultant structure following the removal of the sacrificial spacers (of FIG. 8).

FIG. 10 illustrates a top view of the resultant structure following the removal of the sacrificial spacers 502 (of FIG. 8).

Figure 11:
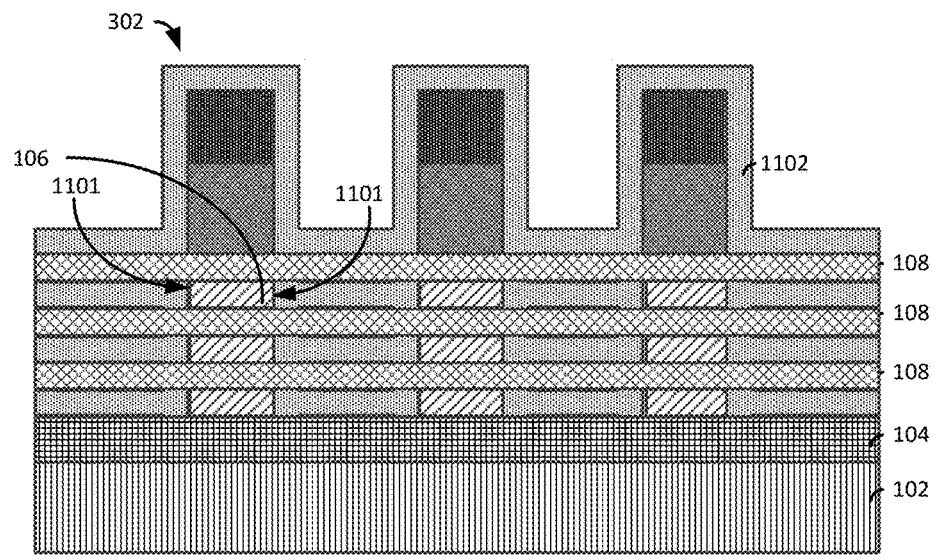
FIG. 11 illustrates a cut-away view along the line A-A (of FIG. 12) following the deposition of a second layer of spacer material.

FIG. 11 illustrates a cut-away view along the line A-A (of FIG. 12) following the deposition of a second layer of spacer material 1102. The second layer of spacer material 1102 is deposited over the sacrificial gates 302, around the nanowires 108, and adjacent to the nanowires 106 such that distal ends 1101 of the nanowires 106 are covered by the second layer of spacer material 1102. Non-limiting examples of suitable materials for the second layer of spacer material 1102 include dielectric oxides (e.g., silicon oxide), dielectric nitrides (e.g., silicon nitride), dielectric oxynitrides, or any combination thereof. The second layer of spacer material 1102 is deposited by a deposition process, for example, chemical vapor deposition (CVD) or physical vapor deposition (PVD). The second layer of spacer material 1102 is formed with a thickness of about 3-15 nm.

Figure 12:
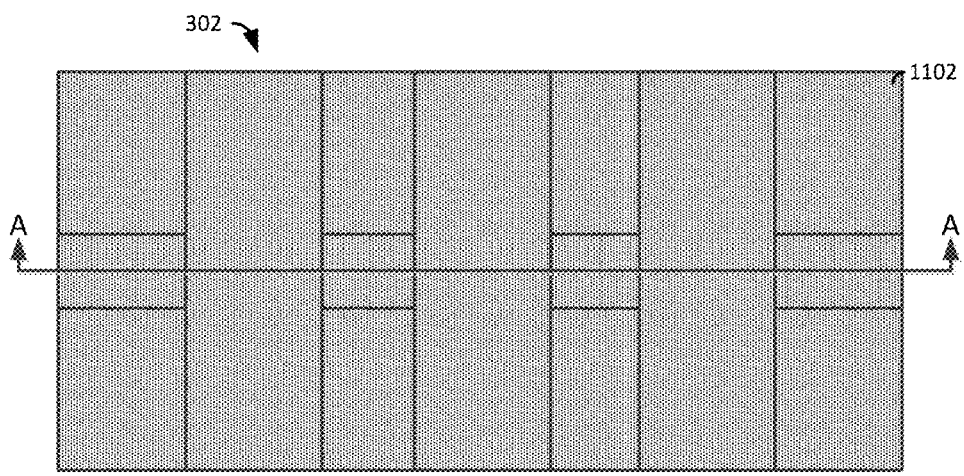
FIG. 12 illustrates a top view following the deposition of the second layer of spacer material.

FIG. 12 illustrates a top view following the deposition of the second layer of spacer material 1102.

Figure 13:
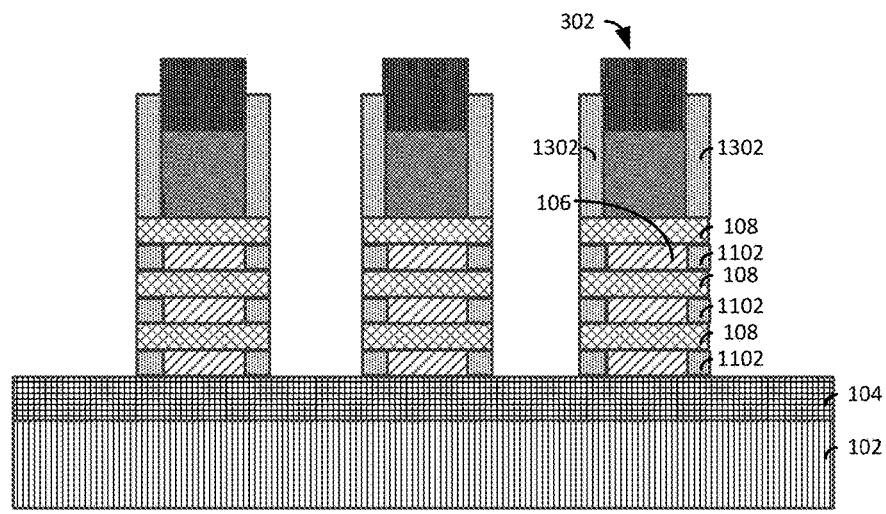
FIG. 13 illustrates a cut-away view along the line A-A (of FIG. 14) following a selective etching process.

FIG. 13 illustrates a cut-away view along the line A-A (of FIG. 14) following a selective etching process such as, for example, a reactive ion etching process that removes portions of the second layer of spacer material 1102 (of FIG. 11) and forms the spacers 1302.

Following the formation of the spacers 1302, a selective anisotropic etching process is performed that removes exposed portions of the nanowires 108. The resultant structure includes the nanowires 106 and nanowires 108 stacked in an arrangement on the insulator layer 104. The sacrificial gates 302 are arranged on the nanowires 106 and 108. The nanowires 106 have a shorter length relative to the length of the nanowires 108. The spacers 1302 are arranged adjacent to the sacrificial gates 302 and the nanowires 106 such that the nanowires 106 are substantially obscured by the nanowires 108 and the spacers 1302.

Figure 14:
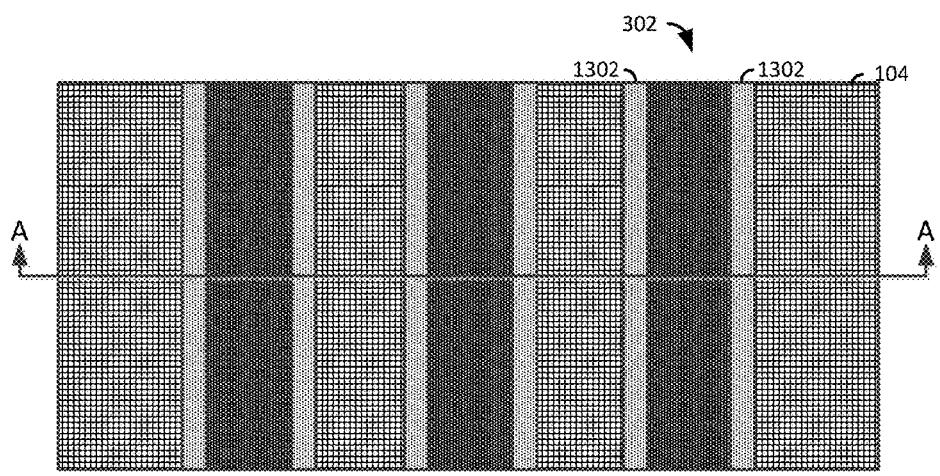
FIG. 14 illustrates a top view following the formation of the spacers and the removal of exposed portions of the nanowires.

FIG. 14 illustrates a top view following the formation of the spacers 1302 and the removal of exposed portions of the nanowires 108.

Figure 15:
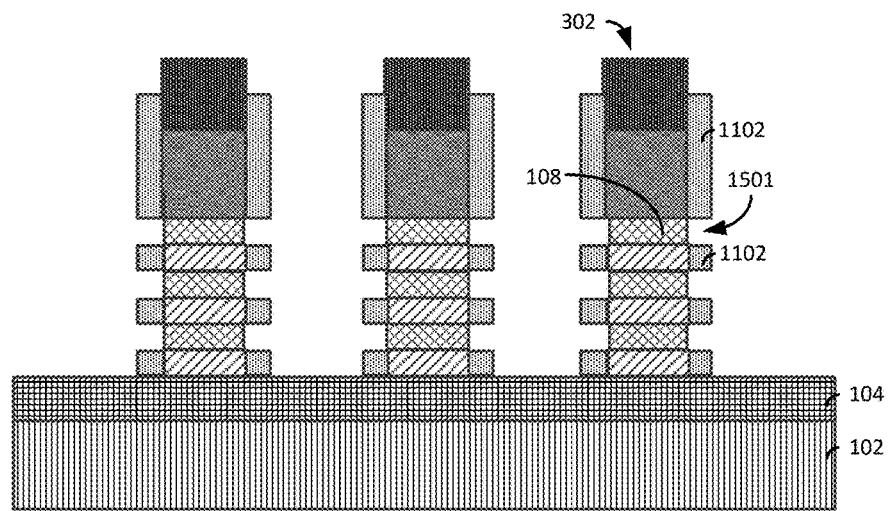
FIG. 15 illustrates a cut-away view along the line A-A (of FIG. 16) of a selective isotropic etching process is performed that removes exposed portions of the nanowires.
Figure 16:
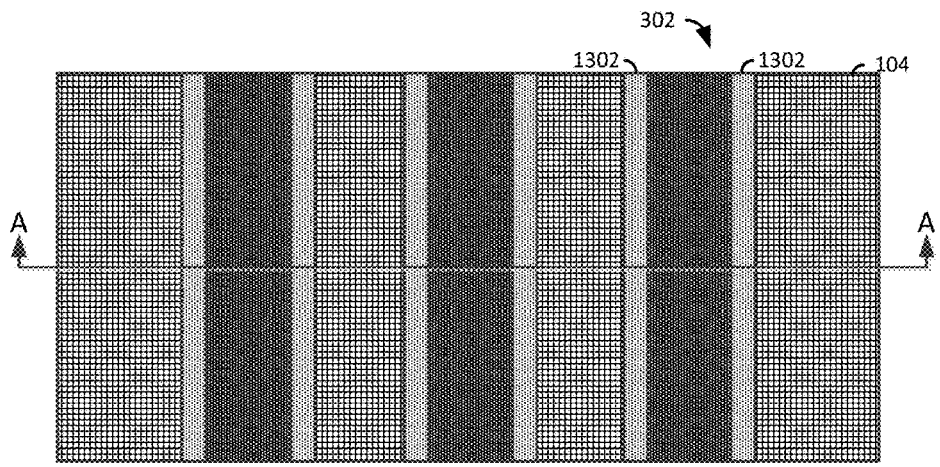
FIG. 16 illustrates a top view following the removal of exposed portions of the nanowires as described in FIG. 15.

FIG. 15 illustrates a cut-away view along the line A-A (of FIG. 16). In FIG. 15, a selective isotropic etching process is performed that removes exposed portions of the nanowires 108. In one embodiment, the nanowire 108 is silicon which can be etched, for example, an aqueous solution containing ammonia. The etching process forms cavities 1501 that are partially defined by the nanowires 108, the spacers 1302, and the sacrificial gates 302.

FIG. 16 illustrates a top view following the removal of exposed portions of the nanowires 108 as described above in FIG. 15.

Figure 17:
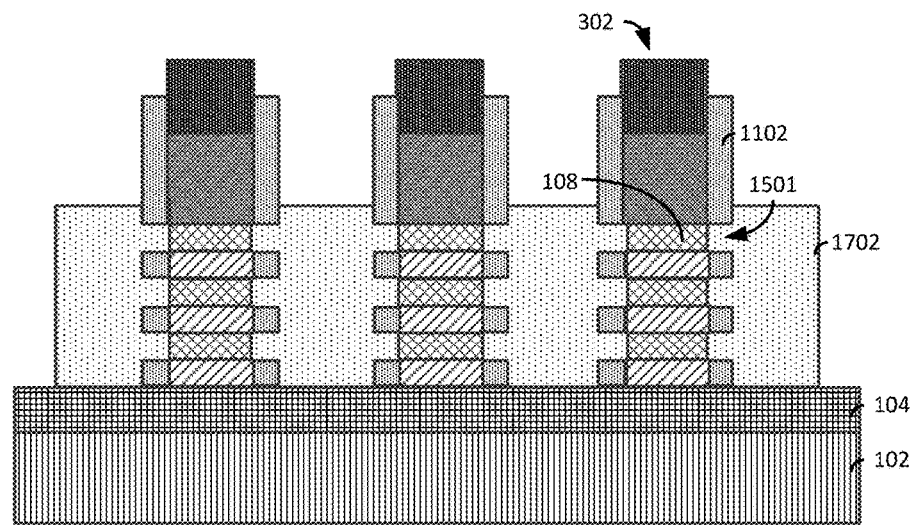
FIG. 17 illustrates a cut-away view along the line A-A (of FIG. 18) after the formation of source/drain regions.

FIG. 17 illustrates a cut-away view along the line A-A (of FIG. 18) after the formation of source/drain regions 1702. The source/drain regions 1702 are formed by an epitaxial growth process that deposits a crystalline overlayer of semiconductor material onto the exposed crystalline seed material of the exposed nanowire 108 to form the source/drain regions 1702.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$ and ranges there between. Preferably the source/drain region is in the range from about $2\times10^{20}$ cm$^{-3}$ to about $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 18:
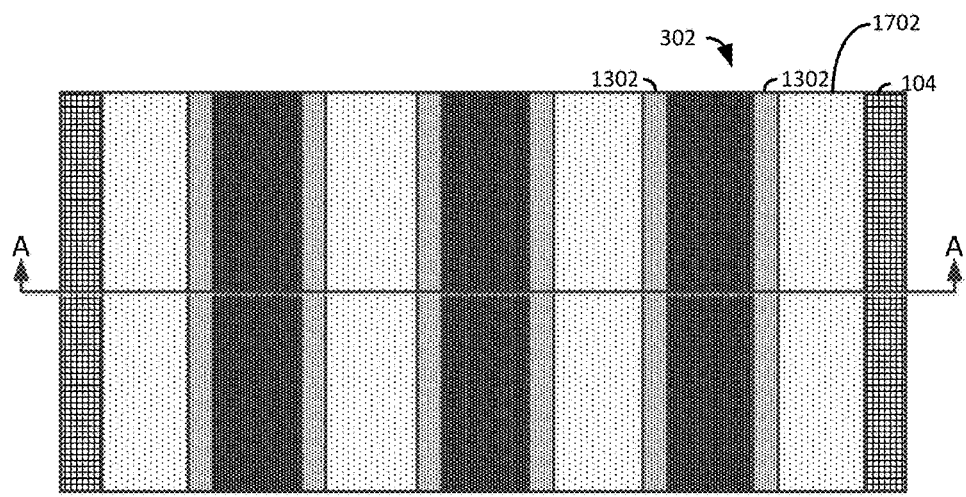
FIG. 18 illustrates a top view of the source/drain regions following the epitaxial growth process described in FIG. 17.

FIG. 18 illustrates a top view of the source/drain regions 1702 following the epitaxial growth process described in FIG. 17.

Figure 19:
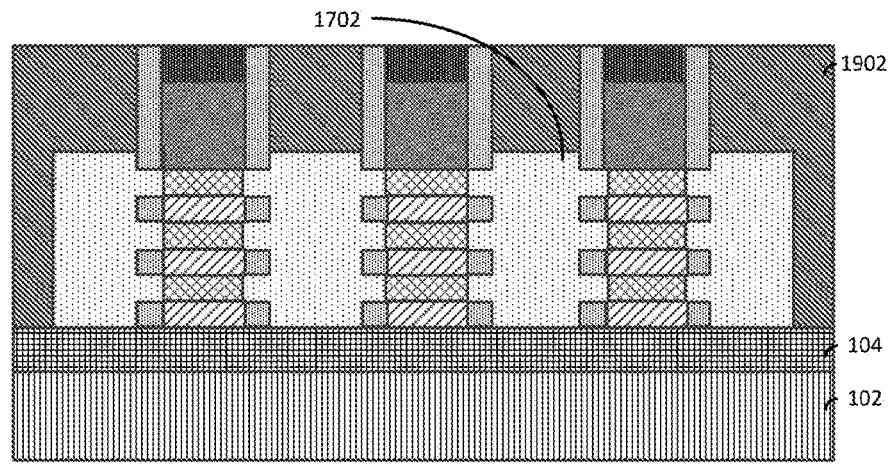
FIG. 19 illustrates a cut-away view along the line A-A (of FIG. 20) following the formation of an inter-level dielectric layer over exposed portions of the source/drain regions and the insulator layer.

FIG. 19 illustrates a cut-away view along the line A-A (of FIG. 20) following the formation of an inter-level dielectric layer 1902 over exposed portions of the source/drain regions 1702 and the insulator layer 104. The inter-level dielectric layer 804 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 1902 is deposited by a deposition process, including, but not limited to CVD, PVD, plasma enhanced CVD, atomic layer deposition (ALD), evaporation, chemical solution deposition, or like processes. Following the deposition of the inter-level dielectric layer 1902, a planarization process such as, for example, chemical mechanical polishing is performed.

Figure 20:
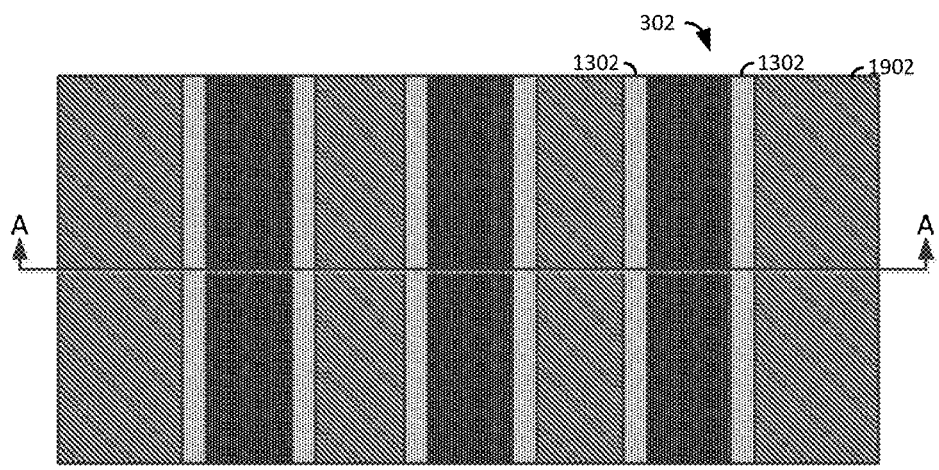
FIG. 20 illustrates a top view following the formation of the inter-level dielectric layer as described in FIG. 19.

FIG. 20 illustrates a top view following the formation of the inter-level dielectric layer 1902 as described in FIG. 19.

Figure 21:
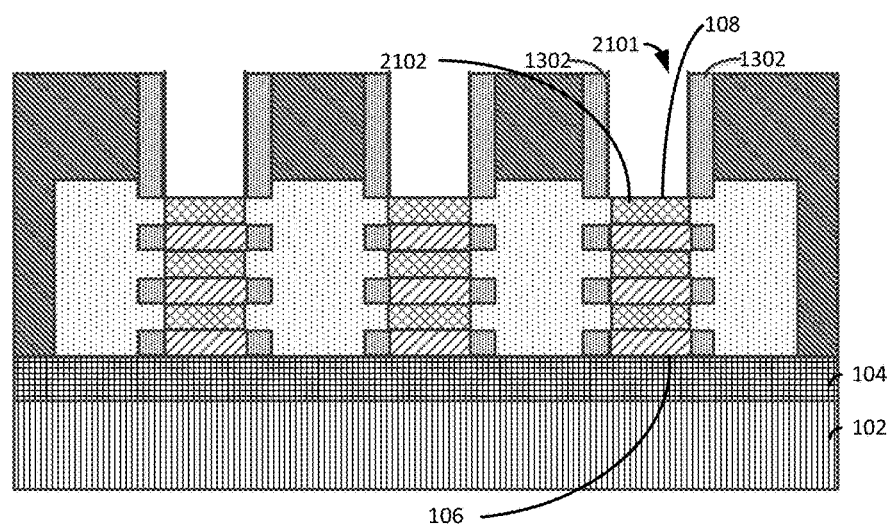
FIG. 21 illustrates a cut-away view along the line A-A (of FIG. 22) following the removal of the sacrificial gates (of FIG. 20).

FIG. 21 illustrates a cut-away view along the line A-A (of FIG. 22) following the removal of the sacrificial gates 302 (of FIG. 20). The sacrificial gate 302 may be removed by performing a dry etch process, for example, RIE, followed by a wet etch process. The wet etch process is selective to (will not substantially etch) the spacers 1302 and the inter-level dielectric layer 804. The chemical etch process may include, but is not limited to, hot ammonia or tetramethyl-ammonium hydroxide (TMAH). A cavity The source/drain regions 1702 are formed by an epitaxial growth process that deposits a crystalline overlayer of semiconductor material onto the exposed crystalline seed material of the exposed second nanowires 408 of the first stack of nanowires 501 to form the source/drain regions 1702.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 22:
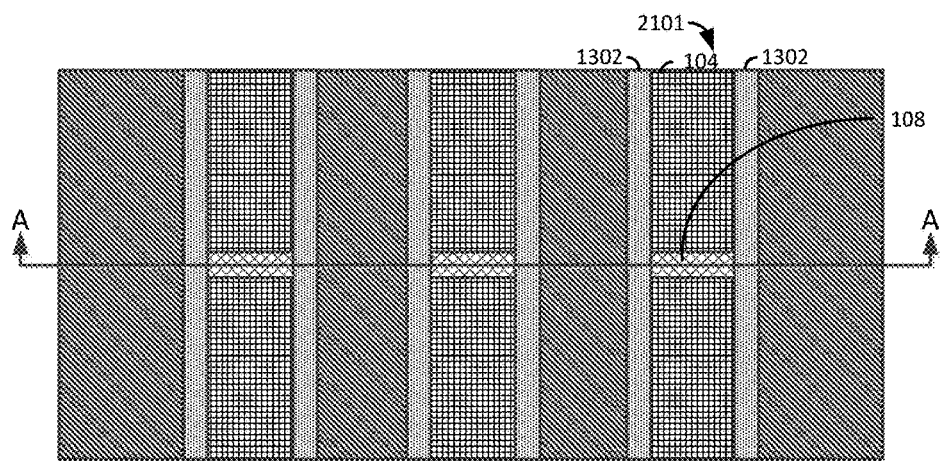
FIG. 22 illustrates a top view of FIG. 21 following the removal of the sacrificial gates (of FIG. 20). The cavity is partially defined by the spacers and the insulator layer.

FIG. 22 illustrates a top view of FIG. 21 following the removal of the sacrificial gates 302 (of FIG. 20). The cavity 2101 is partially defined by the spacers 1302 and the insulator layer 104.

Figure 23:
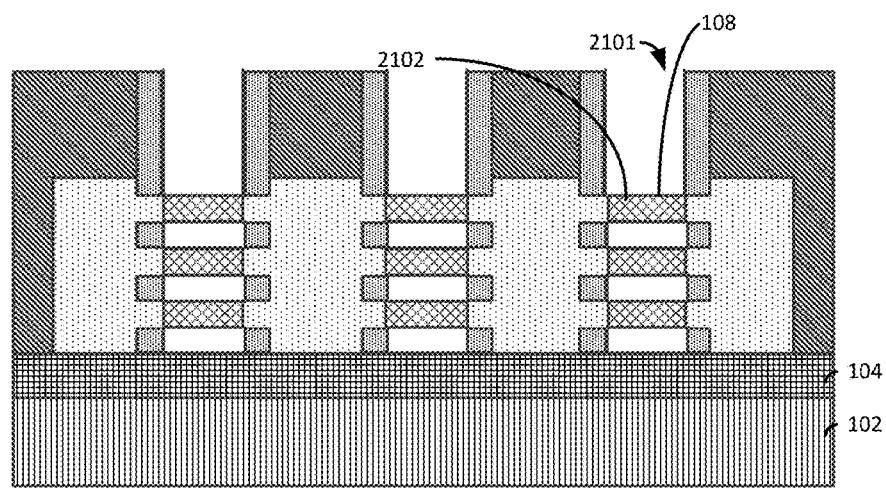
FIG. 23 illustrates a cut-away view along the line A-A (of FIG. 21) following a selective isotropic etch process that removes exposed portions of the nanowires (of FIG. 21) in the cavity.

FIG. 23 illustrates a cut-away view along the line A-A (of FIG. 21) following a selective isotropic etch process that removes exposed portions of the nanowires 106 (of FIG. 21) in the cavity 2101. The removal of the nanowires 106 exposes the nanowires 108 such that a 360 degree surface of the channel region 2102 of the nanowires 108 (as rotated about the linear axis of the nanowires 108) is exposed in the cavity 2101.

Figure 24:
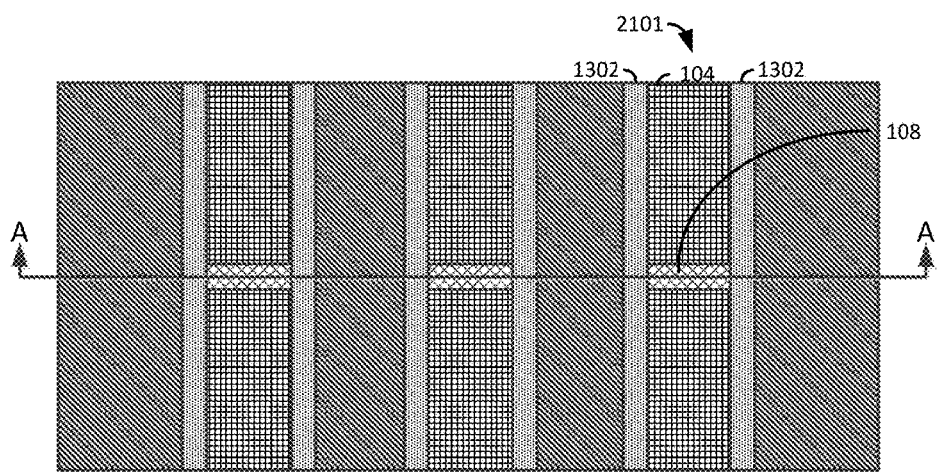
FIG. 24 illustrates a top view of the resultant structure following the removal of the nanowires (of FIG. 21).

FIG. 24 illustrates a top view of the resultant structure following the removal of the nanowires 106 (of FIG. 21).

Figure 25:
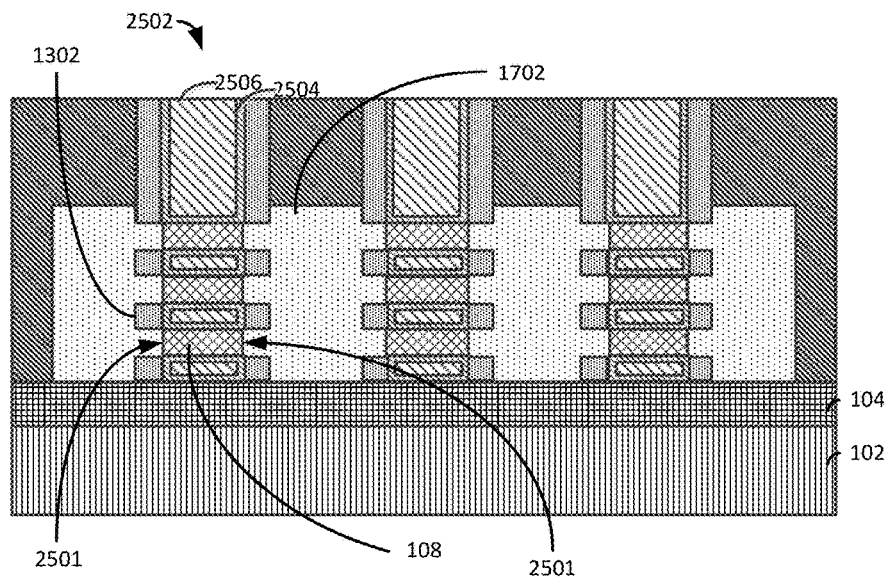
FIG. 25 illustrates a cut-away view along the line A-A (of FIG. 26) after the formation of replacement metal gate stacks (gate stacks).

FIG. 25 illustrates a cut-away view along the line A-A (of FIG. 26) after the formation of replacement metal gate stacks (gate stacks) 2502. The gate stack 2502 includes a high-k metal gate formed, for example, by filling the cavity 2101 with one or more dielectric materials 2504, one or more work function metals 2506, and one or more metal gate conductor materials (not shown). The gate dielectric material(s) 2504 can be a dielectric material having a dielectric constant greater than 3.9, 7.0, or 10.0. Non-limiting examples of suitable materials for the dielectric materials 2504 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric materials 2504 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 2506 may be disposed over the gate dielectric material. The type of work function metal(s) 2506 depends on the type of transistor and may differ between the nFET and pFET devices. Non-limiting examples of suitable work function metals 1504 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor material(s) is deposited over the gate dielectric materials 2504 and work function metal(s) 2506 to form the gate stacks 2502. Non-limiting examples of suitable conductive metals include aluminum (Al), platinum (Pt), gold (Au), tungsten (W), titanium (Ti), or any combination thereof. The gate conductor material(s) 2506 may be deposited by a suitable deposition process, for example, CVD, PECVD, PVD, plating, thermal or e-beam evaporation, and sputtering.

Following the deposition of the gate dielectric materials 2504, the work function metal(s) 2506, and the gate conductor material(s), a planarization process, for example, chemical mechanical planarization (CMP), is performed to remove the overburden of the deposited gate materials and form the gate stack 2502.

The semiconductor device of FIG. 25 has a nanowire stack comprising the nanowires 108. The nanowires 108 include distal ends 2501 such that the channel region of the device is substantially defined by the distal ends 2501. Disconnected portions of the spacer 1302 are surrounded by the source/drain region 1702 and the gate stack 2502.

Figure 26:
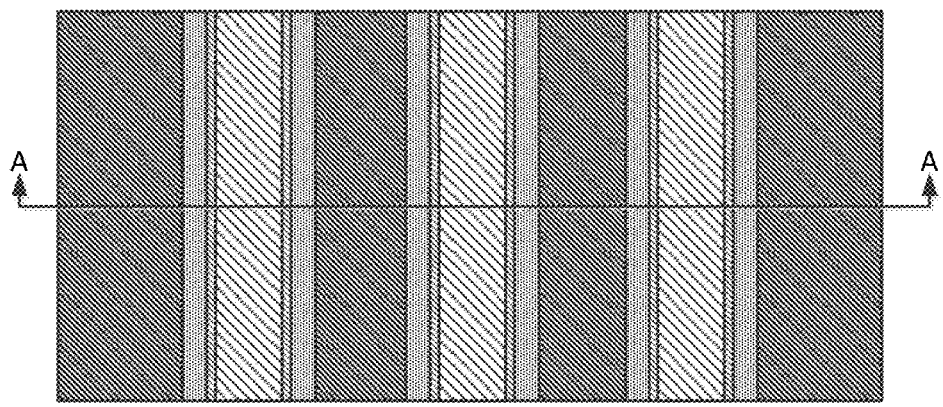
FIG. 26 illustrates a top view following the formation of the gate stack 2502 as described above in FIG. 25.

FIG. 26 illustrates a top view following the formation of the gate stack 2502 as described above in FIG. 25.

After the gate stack 2502 is formed, additional insulating material (not shown) may be deposited over the device(s). The insulating material may be patterned to form cavities (not shown) that expose portions of the source/drain region 1702 and the gate stack 2502. The cavities may be filled by a conductive material (not shown) and, in some embodiments, a liner layer (not shown) to form conductive contacts (not shown).

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a nanowire semiconductor device, the method comprising:
    forming a nanowire stack comprising a first nanowire and a second nanowire arranged on the first nanowire;
    forming a sacrificial gate over the nanowire stack;
    forming a sacrificial spacer adjacent to the sacrificial gate;
    removing one or more portions of the first nanowire to form a first cavity;
    removing the sacrificial spacer;
    depositing a layer of spacer material adjacent to the sacrificial gate and in the first cavity;
    removing a portion of the layer of spacer material to form a spacer adjacent to the sacrificial gate and the first nanowire;
    removing one or more portions of the second nanowire to form a second cavity; and
    epitaxially growing a source/drain region in the second cavity from the one or more portions of the second nanowire.

2. The method of claim 1, further comprising:
    forming an inter-level dielectric layer over portions of the source/drain region;
    removing the sacrificial gate to partially expose a channel region of the second nanowire.

3. The method of claim 2, further comprising removing the first nanowire.

4. The method of claim 3, further comprising forming a gate stack over and around the first nanowire.

5. The method of claim 1, wherein the first cavity is partially defined by the sacrificial spacer, the first nanowire, and the second nanowire, wherein the second cavity is partially defined by the spacer and the second nanowire.

6. The method of claim 1, wherein the forming the sacrificial spacer comprises:
    depositing a layer of spacer material along sidewalls of the sacrificial gate; and
    etching to form the sacrificial spacer.

7. The method of claim 1, wherein the removing the one or more portions of the first nanowire includes an anisotropic etching process.

8. The method of claim 1, wherein the removing the one or more portions of the second nanowire includes an anisotropic etching process.

9. The method of claim 1, wherein the removing the portion of the second nanowire to form the second cavity includes an isotropic etching process.

10. The method of claim 1, wherein the first nanowire includes a first semiconductor material, and the second nanowire includes a second semiconductor material, the first semiconductor material is dissimilar from the second nanowire material.

11. The method of claim 1, wherein the first nanowire includes a silicon material, and the second nanowire includes a silicon germanium material.

12. A method for forming a nanowire semiconductor device, the method comprising:
    forming a semiconductor stack on a substrate, the semiconductor stack comprising a first semiconductor layer and a second semiconductor layer;
    removing portions of the semiconductor stack to form a nanowire stack, the nanowire stack comprising a first nanowire and a second nanowire;
    forming a sacrificial gate over the nanowire stack;
    depositing a first layer of spacer material along sidewalls of the sacrificial gate;
    removing portions of the spacer material to form a sacrificial spacer long sidewalls of the sacrificial gate;
    removing one or more portions of the first nanowire to form a first cavity;
    removing the sacrificial spacer;
    depositing a second layer of spacer material adjacent to the sacrificial gate and in the first cavity;
    removing a portion of the second layer of spacer material to form a spacer adjacent to the sacrificial gate and the first nanowire;
    removing one or more portions of the second nanowire to form a second cavity; and
    epitaxially growing a source/drain region in the second cavity from the one or more portions of the second nanowire.

13. The method of claim 12, further comprising:
    forming an inter-level dielectric layer over portions of the source/drain region;

removing the sacrificial gate to partially expose a channel region of the second nanowire.

14. The method of claim 13, further comprising removing the first nanowire.

15. The method of claim 14, further comprising forming a gate stack over and around the first nanowire.

16. The method of claim 12, wherein the first cavity is partially defined by the sacrificial spacer, the first nanowire, and the second nanowire, wherein the second cavity is partially defined by the spacer and the second nanowire.

17. The method of claim 12, wherein the removing the one or more portions of the first nanowire includes an anisotropic etching process.

18. The method of claim 12, wherein the removing the one or more portions of the second nanowire includes an anisotropic etching process.

19. The method of claim 12, wherein the removing the portion of the second nanowire to form the second cavity includes an isotropic etching process.

20. The method of claim 12, wherein the first nanowire includes a first semiconductor material, and the second nanowire includes a second semiconductor material, the first semiconductor material is dissimilar from the second nanowire material.

* * * * *